(12) United States Patent
Takai (10) Patent No.: US 10,107,857 B2
(45) Date of Patent: Oct. 23, 2018

(54) OPTICAL COUPLING DEVICE (71) Applicant: KABUSHIKI KAISHA TOSHIBA, Tokyo (JP)

(72) Inventor: Naoya Takai, Yukuhashi Fukuoka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 25 days.

(21) Appl. No.: 15/231,319

(22) Filed: Aug. 8, 2016

(65) Prior Publication Data
US 2017/0176519 A1 Jun. 22, 2017

(30) Foreign Application Priority Data
Dec. 17, 2015 (JP) .................................. 2015-246460

(51) Int. Cl.
G01R 31/00 (2006.01)
G01R 31/30 (2006.01)
H01L 21/66 (2006.01)
G01R 31/265 (2006.01)
G01R 31/317 (2006.01)

(52) U.S. Cl.
CPC ....... *G01R 31/3004* (2013.01); *G01R 31/265* (2013.01); *H01L 22/34* (2013.01); *G01R 31/31728* (2013.01)

(58) Field of Classification Search
CPC .......... G01R 31/3004; G01R 31/31728; G01R 31/265; H01L 22/34
USPC ............. 324/750.01, 754.23, 762.08–762.09
See application file for complete search history.

(56) References Cited

U.S. PATENT DOCUMENTS 5,963,785 A * 10/1999 Katoh ............... H01L 21/76264
257/E21.564
6,285,084 B1 * 9/2001 Hikita ............... H01L 23/49575
257/777

(Continued)

FOREIGN PATENT DOCUMENTS

JP 2002185033 A 6/2002
JP 2004193341 A 7/2004

(Continued)

OTHER PUBLICATIONS

Japanese Office Action dated May 14, 2018, filed in Japanese counterpart Application No. 2015-246460, 6 pages (with translation).

Primary Examiner — Jermele M Hollington
Assistant Examiner — Sean Curtis
(74) Attorney, Agent, or Firm — Patterson & Sheridan, LLP (57) ABSTRACT An optical coupler device includes, on a substrate, a first light-receiving element coupled to a first light-emitting element and a second light-receiving element coupled to a second light-emitting element. First, second, and third terminals are disposed on the first substrate. A first transistor pair and a second transistor pair are disposed on the first substrate. The first transistor pair is configured to electrically connect and disconnect the first and second terminals in response to a first light signal received by the first light-receiving element. The second transistor pair is configured to electrically connect and disconnect the second and third terminals in response to a second light signal received by the second light-receiving element.

15 Claims, 8 Drawing Sheets (56) References Cited

U.S. PATENT DOCUMENTS

| | | | |
|---|---|---|---|
| 6,548,880 B1* | 4/2003 | Hirasawa | H01L 31/167 257/414 |
| 6,845,184 B1 | 1/2005 | Yoshimura et al. | |
| 7,095,267 B2* | 8/2006 | Sato | H03K 17/04123 250/551 |
| 7,235,803 B2* | 6/2007 | Matsuyama | H03K 17/04106 250/214 R |
| 7,235,804 B2* | 6/2007 | Aki | H01L 27/15 250/551 |
| 7,385,255 B2* | 6/2008 | Kitagawa | H01L 25/167 257/368 |
| 8,410,464 B2* | 4/2013 | Omura | H01L 27/1446 250/551 |
| 8,761,599 B2* | 6/2014 | Uo | H04B 10/802 398/189 |
| 8,816,310 B2* | 8/2014 | Hoshino | H01L 31/147 250/239 |
| 9,070,817 B2* | 6/2015 | Fujimoto | H01L 31/173 |
| 9,099,602 B2* | 8/2015 | Noguchi | H01L 31/162 |
| 9,171,969 B2* | 10/2015 | Yamamoto | H01L 31/02005 |
| 9,379,095 B2* | 6/2016 | Noguchi | H01L 31/162 |
| 9,379,273 B2* | 6/2016 | Yamamoto | H01L 31/02005 |
| 9,398,664 B2* | 7/2016 | Wirth | H05B 33/0857 |
| 9,450,134 B2* | 9/2016 | Takai | G02B 6/4259 |
| 9,722,127 B2* | 8/2017 | Yamamoto | H01L 31/02005 |
| 2005/0029633 A1* | 2/2005 | Yumura | H01L 25/167 257/666 |
| 2005/0035356 A1* | 2/2005 | Kek | H01L 25/167 257/81 |
| 2005/0207697 A1* | 9/2005 | Kek | H01L 25/167 385/15 |
| 2005/0280403 A1* | 12/2005 | Sato | H03K 17/04123 323/282 |
| 2006/0231894 A1* | 10/2006 | Kitagawa | H01L 29/0634 257/347 |
| 2007/0187629 A1* | 8/2007 | Matsuyama | H01L 31/14 250/551 |
| 2009/0121777 A1* | 5/2009 | Nakajima | H01L 25/167 327/493 |
| 2010/0270483 A1* | 10/2010 | Omura | H01L 27/1446 250/551 |
| 2011/0235974 A1* | 9/2011 | Tay | G02B 6/43 385/39 |
| 2012/0199851 A1* | 8/2012 | Hoshino | H01L 31/147 257/81 |
| 2013/0200397 A1* | 8/2013 | Biwa | H01L 31/173 257/82 |
| 2014/0084305 A1* | 3/2014 | Fujimoto | H01L 31/173 257/82 |
| 2014/0284629 A1* | 9/2014 | Takai | G02B 6/4259 257/82 |
| 2015/0060892 A1* | 3/2015 | Noguchi | H01L 31/162 257/82 |
| 2015/0069423 A1* | 3/2015 | Yamamoto | H01L 31/02005 257/82 |
| 2015/0262985 A1* | 9/2015 | Takai | H01L 25/167 257/82 |
| 2015/0262986 A1* | 9/2015 | Takai | H01L 25/167 257/82 |
| 2015/0263184 A1* | 9/2015 | Takai | H01L 31/167 257/82 |
| 2015/0303180 A1* | 10/2015 | Noguchi | H01L 31/162 257/82 |
| 2016/0013353 A1* | 1/2016 | Yamamoto | H01L 31/02005 257/668 |
| 2016/0268241 A1* | 9/2016 | Yamamoto | H01L 31/02005 |
| 2017/0069610 A1* | 3/2017 | Takai | H01L 31/00 |
| 2017/0176519 A1* | 6/2017 | Takai | G01R 31/3004 |

FOREIGN PATENT DOCUMENTS

| | | |
|---|---|---|
| JP | 2009042469 A | 2/2009 |
| JP | 2009123804 A | 6/2009 |
| JP | 2011014932 A | 1/2011 |
| JP | 2015056531 A | 3/2015 |

* cited by examiner

OPTICAL COUPLING DEVICE

CROSS-REFERENCE TO RELATED APPLICATION

This application is based upon and claims the benefit of priority from Japanese Patent Application No. 2015-246460, filed Dec. 17, 2015, the entire contents of which are incorporated herein by reference.

FIELD

Embodiments described herein relate generally to optical coupling devices.

BACKGROUND

A photorelay, which is an example of an optical coupling device, is sometimes used as a signal selector switch in measuring instruments such as a tester. In this case, the total installation area of the photorelays is increased since a large number of photorelays is used. Therefore, in such applications, photorelays of a small size are preferable.

Examples of a photorelay used as the signal selector switch include a photorelay that switches between input states in which a high-frequency signal is input or not to an object to be measured and a photorelay that switches between states in which a low-frequency DC signal is input or not to the object to be measured. The output terminals of these different photorelays are electrically connected to each other by external wiring. As a result, there is a possibility that, when the high-frequency signal is being input via one photorelay in an ON state a current leaks via the external wiring to the another photorelay that is in an OFF state. This current leakage affects the characteristics of the other photorelay.

DETAILED DESCRIPTION

In general, according to one embodiment, an optical coupling device includes a first light-receiving element that is disposed on a first substrate and coupled to a first light-emitting element, and a second light-receiving element that is disposed on the first substrate to be adjacent to the first light-receiving element and coupled to a second light-emitting element. A first terminal is disposed on the first substrate. A second terminal is disposed on the first substrate and adjacent to the first terminal. A third terminal is disposed on the first substrate and adjacent to second terminal. A first transistor pair is disposed on the first substrate and configured to electrically connect and disconnect the first and second terminals in response to a first light signal received by the first light-receiving element. A second transistor pair is disposed on the first substrate and configured to electrically connect and disconnect the second and third terminals in response to a second light signal received by the second light-receiving element.

Hereinafter, example embodiments will be described with reference to the drawings. It is noted that the present disclosure is not limited to the following example embodiments.

(First Embodiment)

Figure 1:
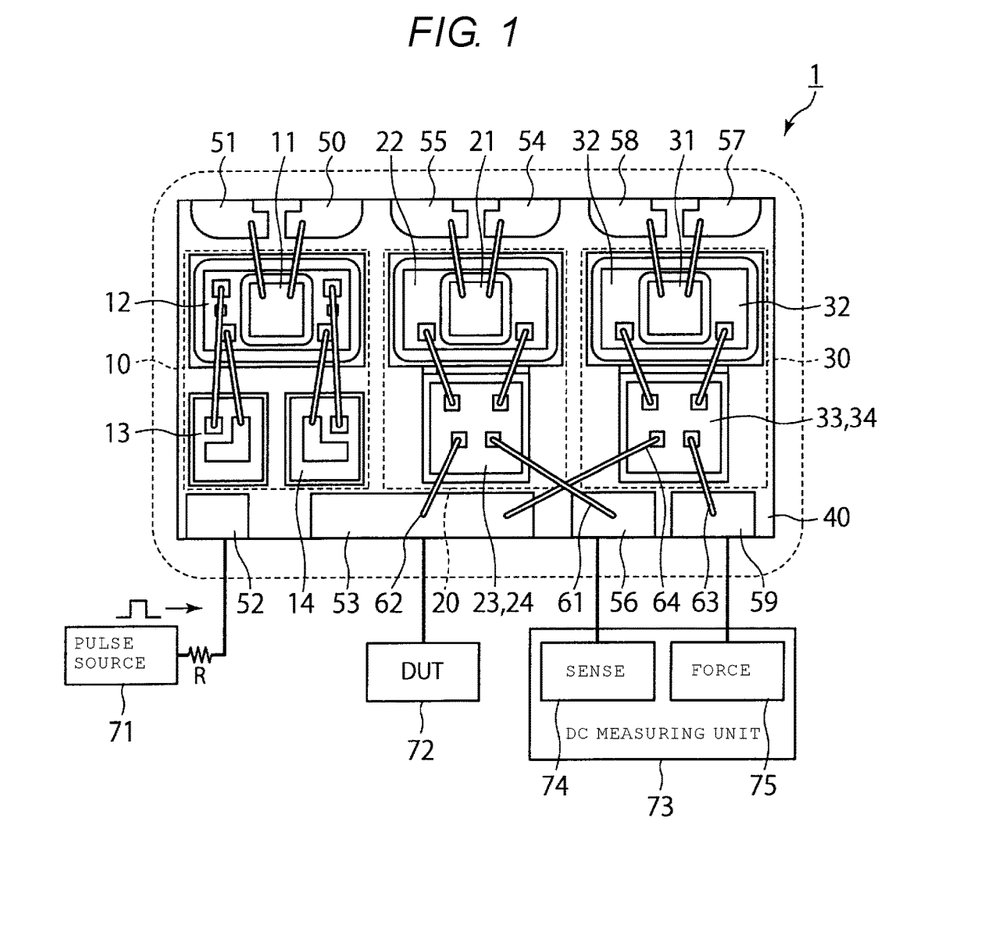
FIG. 1 is a plan view depicting the internal configuration of an optical coupling device according to a first embodiment.
Figure 2:
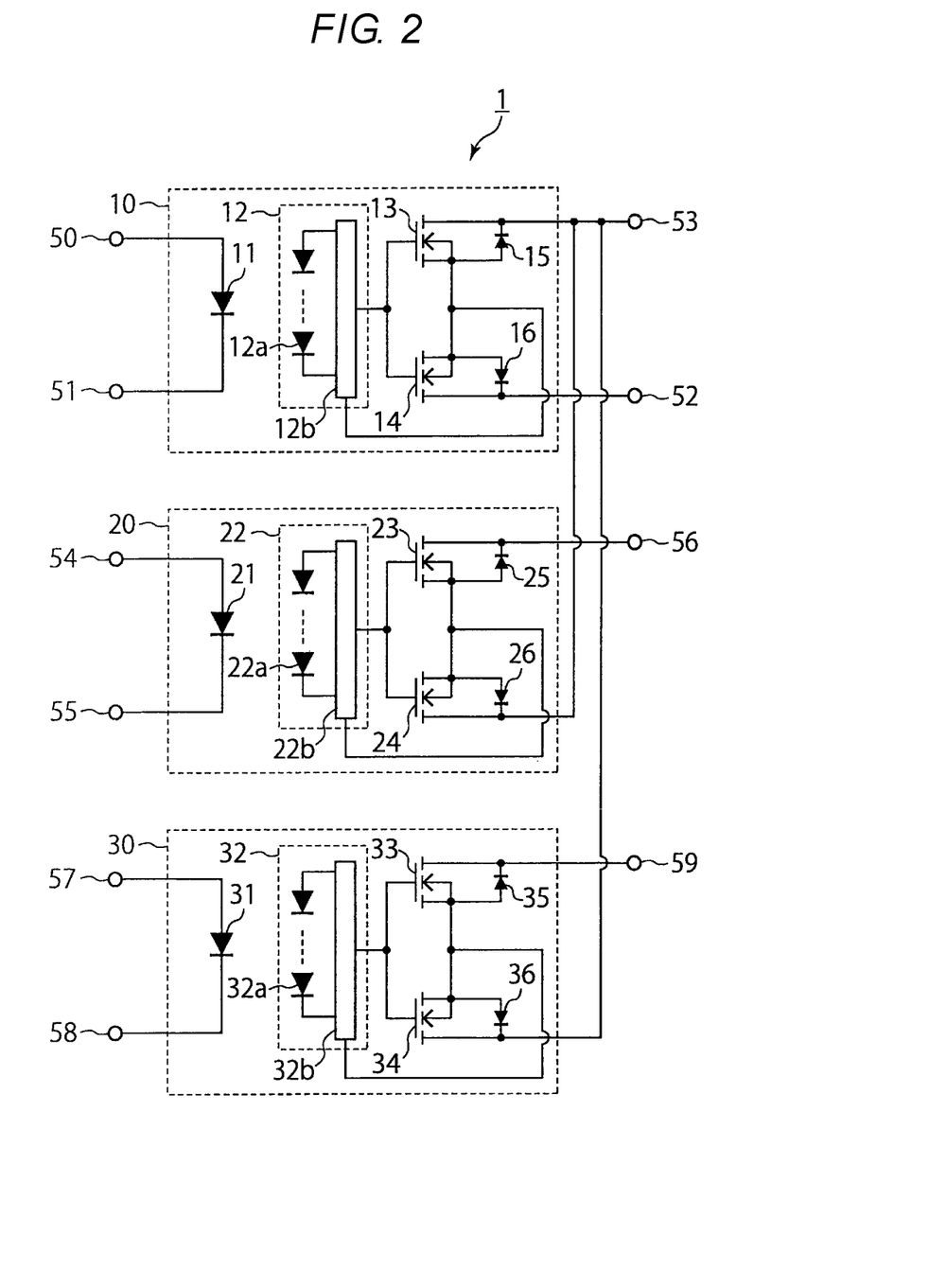
FIG. 2 is a circuit diagram of the optical coupling device according to the first embodiment.

FIG. 1 is a plan view depicting the internal configuration of an optical coupling device according to a first embodiment. In FIG. 1, an optical coupling device 1 according to the first embodiment is used in a tester for a semiconductor device. FIG. 2 is a circuit diagram of the optical coupling device 1 according to the first embodiment.

As depicted in FIGS. 1 and 2, the optical coupling device 1 includes photorelays 10, 20, and 30, a substrate 40, and terminals 50, 51, 52, 53, 54, 55, 56, 57, 58, and 59.

The photorelay 10 includes a light-emitting element 11 (a first light-emitting element), a light-receiving element 12 (a first light-receiving element), and N-type MOS transistors 13 and 14 (a first MOS transistor pair). As the light-emitting element 11, for example, a light-emitting diode (LED) can be used. As depicted in FIG. 2, the anode of the light-emitting element 11 is connected to the terminal 50 and the cathode of the light-emitting element 11 is connected to the terminal 51.

The light-receiving element 12 is placed on the substrate 40 in such a way as to face the light-emitting element 11. In the first embodiment, the light-emitting element 11 is fixed to a top surface of the light-receiving element 12 with a transparent adhesive. Moreover, as depicted in FIG. 2, the light-receiving element 12 includes a control circuit 12b and a plurality of photodiodes 12a. The plurality of photodiodes 12a receives light emitted from the light-emitting element 11. The control circuit 12b controls the N-type MOS transistors 13 and 14 based on the state of the plurality of photodiodes 12a-that is, whether the photodiodes 12a are receiving light or not.

As depicted in FIG. 2, the gates of the N-type MOS transistors 13 and 14 are connected to the control circuit 12b. The drain of the N-type MOS transistor 13 is connected to the terminal 53, and the drain of the N-type MOS transistor 14 is connected to the terminal 52. The source of the N-type MOS transistor 13 and the source of the N-type MOS transistor 14 are connected to each other. The N-type MOS transistor 13 incorporates a body diode 15, and the N-type MOS transistor 14 incorporates a body diode 16.

Figure 3:
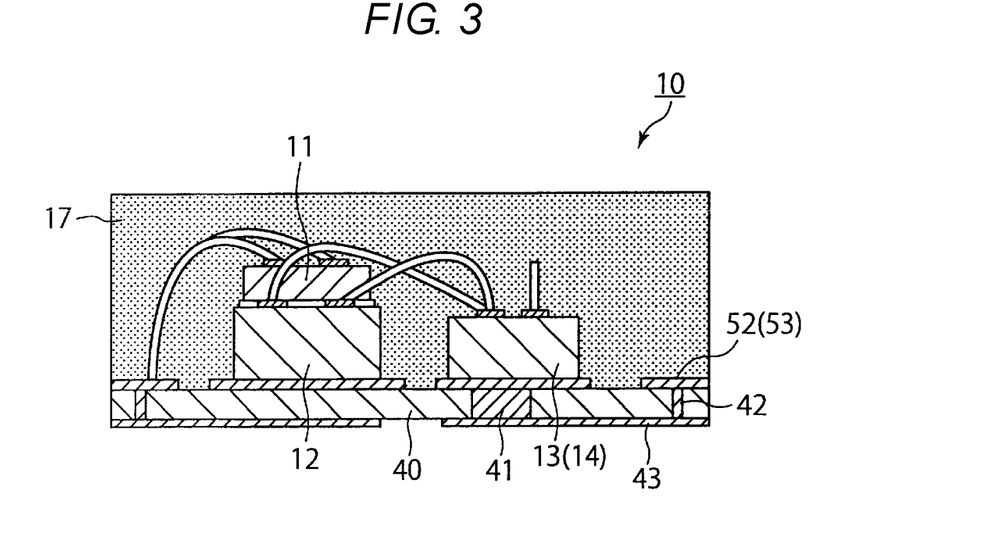
FIG. 3 is a diagram of a photorelay seen through a side surface thereof.

FIG. 3 is a diagram of the photorelay 10 seen through a side surface thereof. As depicted in FIG. 3, the light-emitting element 11, the light-receiving element 12, and the N-type MOS transistors 13 and 14 are covered with resin 17. In the substrate 40, a via 41 and a via 42, are provided. The via 41 and the via 42 are connected by a conductor 43. The via 41 passes through the substrate 40 in a region immediately below the N-type MOS transistors 13 and 14. The via 42 passes through the substrate 40 in a region immediately below the terminal 52. The conductor 43 disposed on the backside of substrate 40 electrically connects the via 41 and the via 42.

The drains of the N-type MOS transistors 13 and 14 are thus connected to the terminals 52 and 53 through the vias 41 and 42 and the conductor 43. In each of the N-type MOS transistors 13 and 14, the drain is provided on a surface (a rear surface of a chip) facing the substrate 40 the gate and the source are provided on a surface (a front surface of the chip) facing away from substrate 40. That is, the N-type MOS transistors 13 and 14 are N-type MOSFETs having a so-called vertical structure.

Referring back to FIGS. 1 and 2, the photorelay 20 will now be described. As depicted in FIG. 1, the photorelay 20 is disposed next to the photorelay 10 on the substrate 40. As depicted in FIG. 2, the photorelay 20 includes a light-emitting element 21 (a second light-emitting element), a light-receiving element 22 (a second light-receiving element), and N-type MOS transistors 23 and 24 (a second MOS transistor pair). Furthermore, the light-receiving element 22 includes a control circuit 22b and a plurality of photodiodes 22a.

Since the light-emitting element 21 has a similar configuration as the above-described light-emitting element 11 and the light-receiving element 22 has a similar configuration as the above-described light-receiving element 12, detailed description on these elements will be omitted.

As depicted in FIG. 2, the gates of the N-type MOS transistors 23 and 24 are connected to the control circuit 22b. The drain of the N-type MOS transistor 23 is connected to the terminal 56. The drain of the N-type MOS transistor 24 is connected to the terminal 53 (which is also connected to the drain of the N-type MOS transistor 13). The source of the N-type MOS transistor 23 and the source of the N-type MOS transistor 24 are connected to each other. The N-type MOS transistor 23 incorporates a body diode 25, and the N-type MOS transistor 24 incorporates a body diode 26.

As depicted in FIG. 1, the N-type MOS transistor 23 and the N-type MOS transistor 24 are provided on one chip. Moreover, the drain of the N-type MOS transistor 23 is connected to the terminal 56 by a conductor 61 (e.g., a bonding wire), and the drain of the N-type MOS transistor 24 is connected to the terminal 53 by a conductor 62 (e.g., a bonding wire). As such, each of the N-type MOS transistors 23 and 24 can be an N-type MOSFET having a so-called horizontal structure in which the gate, the drain, and the source are provided on the same (front) surface of a chip.

As depicted in FIG. 1, the photorelay 30 is disposed next to the photorelay 20 on the substrate 40 on the side opposite to the photorelay 10. As depicted in FIG. 2, the photorelay 30 includes a light-emitting element 31 (a third light-emitting element), a light-receiving element 32 (a third light-receiving element), and N-type MOS transistors 33 and 34 (a third MOS transistor pair). Furthermore, the light-receiving element 32 has a plurality of photodiodes 32a and a control circuit 32b.

Since the light-emitting element 31 has a similar configuration as the above-described light-emitting element 11 and the light-receiving element 32 has a similar configuration as the above-described light-receiving element 12, additional description on these elements will be omitted.

As depicted in FIG. 2, the gates of the N-type MOS transistors 33 and 34 are connected to the control circuit 32b. The drain of the N-type MOS transistor 33 is connected to the terminal 59. The drain of the N-type MOS transistor 34 is connected to the terminal 53, which is also connected to the drain of the N-type MOS transistor 13 and the drain of the N-type MOS transistor 24. The source of the N-type MOS transistor 33 and the source of the N-type MOS transistor 34 are connected to each other. The N-type MOS transistor 33 incorporates a body diode 35, and the N-type MOS transistor 34 incorporates a body diode 36.

As depicted in FIG. 1, as is the case with the N-type MOS transistors 23 and 24, the N-type MOS transistor 33 and the N-type MOS transistor 34 are both on a single chip. Moreover, the drain of the N-type MOS transistor 33 is connected to the terminal 59 by a conductor 63 (e.g., bonding wire), and the drain of the N-type MOS transistor 34 is connected to the terminal 53 by a conductor 64 (e.g., a bonding wire). That is, in this first embodiment, the N-type MOS transistors 33 and 34 are N-type MOSFETs having a horizontal structure as is also the case with the N-type MOS transistors 23 and 24.

The terminals 50, 51, 54, 55, 57, and 58 are provided along a first end (edge) of the substrate 40. These terminals correspond to input terminals through which a current is input to the light-emitting elements 11, 21, and 31.

The terminals 52, 53, 56, and 59 are provided along a second end (edge) on the side opposite to the input terminals across the photorelays 10 to 30. These terminals correspond to output terminals through which electrical signals obtained by photoelectric conversion in the light-receiving elements 12, 22, and 32 are output from the device. In particular, terminal 53 corresponds to a common terminal to which the drains of the plurality of MOS transistors are connected.

As depicted in FIG. 1, when the optical coupling device 1 according to the first embodiment is used as a tester, the terminal 52 is connected to a pulse source 71 via a resistor R. The terminal 53 is connected to a device under test (DUT) 72, which is a device being tested. Furthermore, the terminal 56 is connected to a sense pin 74 of a DC measuring unit 73, and the terminal 59 is connected to a force pin 75.

When the DUT 72 is tested using a high-frequency signal (which is output from the pulse source 71), an external current is supplied between the terminal 50 and the terminal 51. In response thereto, the light-emitting element 11 emits light and the N-type MOS transistors 13 and 14 are brought into an ON state. As a result, the high-frequency signal from the pulse source 71 input to the terminal 52 is output from the terminal 53 via the N-type MOS transistors 13 and 14 (connection from MOS transistor 13 drain to terminal 53 made though via 41, conductor 43, and via 42). The DUT 72 is tested with this high-frequency signal.

At this time, external current is not supplied between the terminal 54 and the terminal 55. As a result, the light-emitting element 21 does not emit light and the N-type MOS transistors 23 and 24 are brought into an OFF state. Likewise, since external current is not supplied between the terminal 57 and the terminal 58, the light-emitting element 31 does not emit light and the N-type MOS transistors 33 and 34 are also brought into an OFF state.

Moreover, when the DUT 72 is tested using a DC signal, which is output from the force pin 75, the light-emitting element 11 is controlled to not emit light (e.g., an external current is not supplied between the terminal 50 and the terminal 51) and the N-type MOS transistors 13 and 14 are placed into an OFF state. On the other hand, since external current is supplied between the terminal 54 and the terminal 55, the light-emitting element 21 emits light and the N-type MOS transistors 23 and 24 are placed into an ON state. At the same time, the light-emitting element 31 also emits light and the N-type MOS transistors 33 and 34 are also brought into an ON state since the external current is supplied also between the terminal 57 and the terminal 58.

As a result, the DC signal of the force pin 75 is input to the terminal 59 and output from the terminal 53 through the N-type MOS transistors 33 and 34. The DUT 72 is tested with this DC signal. Moreover, a current output from the DUT 72 by this test is input to the terminal 53 and output from the terminal 56 through the N-type MOS transistors 23 and 24. This output current is detected on the sense pin 74.

Figure 4:
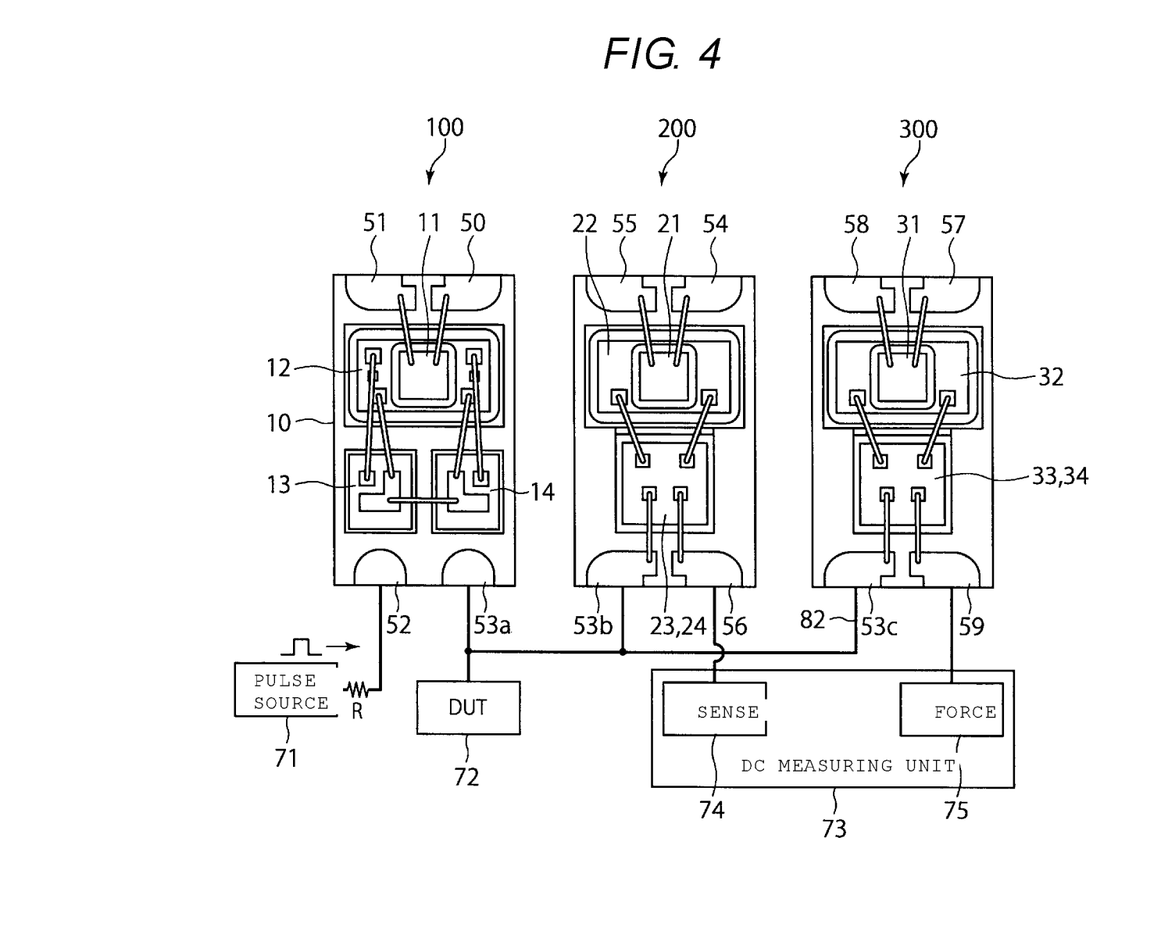
FIG. 4 is a wiring diagram for three photorelays each used singly as a tester.

FIG. 4 is a wiring diagram when the three photorelays are provided on three separate substrates incorporated within a tester apparatus. In FIG. 4, a photorelay 100, a photorelay 200, and a photorelay 300 are used for testing a DUT 72. In FIG. 4, the component elements similar to the component elements of the above-described photorelays 10 to 30 are given the same reference numerals and detailed description thereon will be omitted.

With reference to FIG. 4, when the three photorelays 100, 200, and 300 are each supplied singly (that is, on separate substrates), since some space must be left between these three separate photorelays (100 to 300), the overall installation area is increased in the tester apparatus. Furthermore, any attempt to reduce the size of each of these photorelay also will decrease the space between terminal 53b and a terminal 56 in the photorelay 200 and the space between a terminal 53c and a terminal 59 in the photorelay 300. As a result, when DUT 72 is being tested with a high-frequency signal (output from a pulse source 71), a leakage current of a high-frequency component more easily flows through the photorelay 200 and the photorelay 300 by capacitance coupling and increases with decreased distance between the photorelay terminals.

On the other hand, according to the first embodiment, as depicted in FIG. 1, the three photorelays 10 to 30 are integrated on one substrate and the terminal 53, which is connected to the DUT 72, is formed as a common terminal. As a result, since unnecessary space between the photorelays is eliminated, size reduction can be achieved without increase in leakage current of a high-frequency component during testing. Furthermore, forming the terminal 53 as a common terminal allows the space between the terminal 53 and the terminal 56 or the space between the terminal 53 and the terminal 59 to be increased. This makes capacitive coupling between the terminals less likely to occur and therefore can reduce a leakage current of a high-frequency component.

(First Modified Example)

Figure 5:
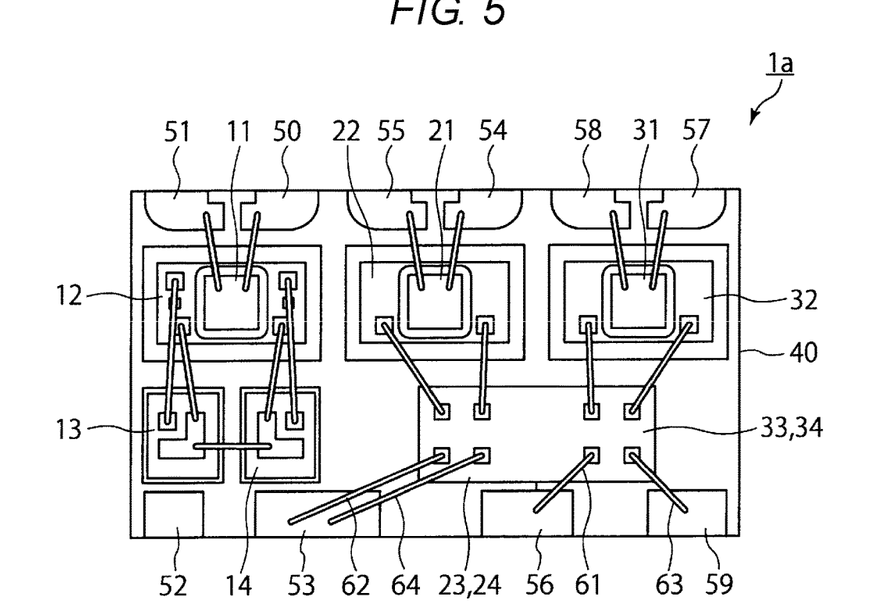
FIG. 5 is a plan view depicting the internal configuration of an optical coupling device according to a first modified example.

FIG. 5 is a plan view depicting the internal configuration of an optical coupling device according to a first modified example of the first embodiment.

As depicted in FIG. 5, in an optical coupling device 1a according to this modified example, the N-type MOS transistors 23 and 24 (forming the second MOS transistor) and the N-type MOS transistors 33 and 34 (forming the third MOS transistor) are provided on one chip.

According to this modified example, the conductor 64 can connect the drain of the MOS transistor 34 and the terminal 53 without crossing the conductor 61. In other words, the conductor 64 can be disposed near the conductor 62. As a result, since the area of the terminal 53 can be reduced as compared to the first embodiment, the space between the terminal 53 and the terminal 56 and the space between the terminal 53 and the terminal 59 can be further increased. This makes capacitive coupling between the terminals less likely to occur and therefore can further reduce a leakage current of a high-frequency component.

(Second Modified Example)

Figure 6:
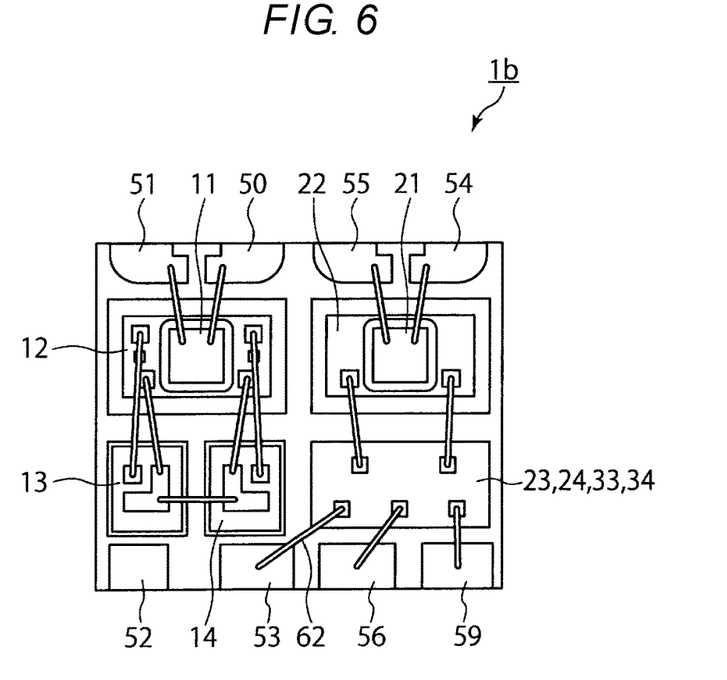
FIG. 6 is a plan view depicting the internal configuration of an optical coupling device according to a second modified example.

FIG. 6 is a plan view depicting the internal configuration of an optical coupling device according to a second modified example of the first embodiment. Moreover, FIG. 7 is a circuit diagram of the optical coupling device according to the second modified example.

As depicted in FIG. 6, in an optical coupling device 1b according to this second modified example, as is the case with the first modified example, the N-type MOS transistors 23 and 24 forming the second MOS transistor and the N-type MOS transistors 33 and 34 forming the third MOS transistor are provided on one chip.

When the optical coupling device 1b is used as a tester for the DUT 72, the N-type MOS transistors 23 and 24 are turned on and off in synchronization with the N-type MOS transistors 33 and 34.

Figure 7:
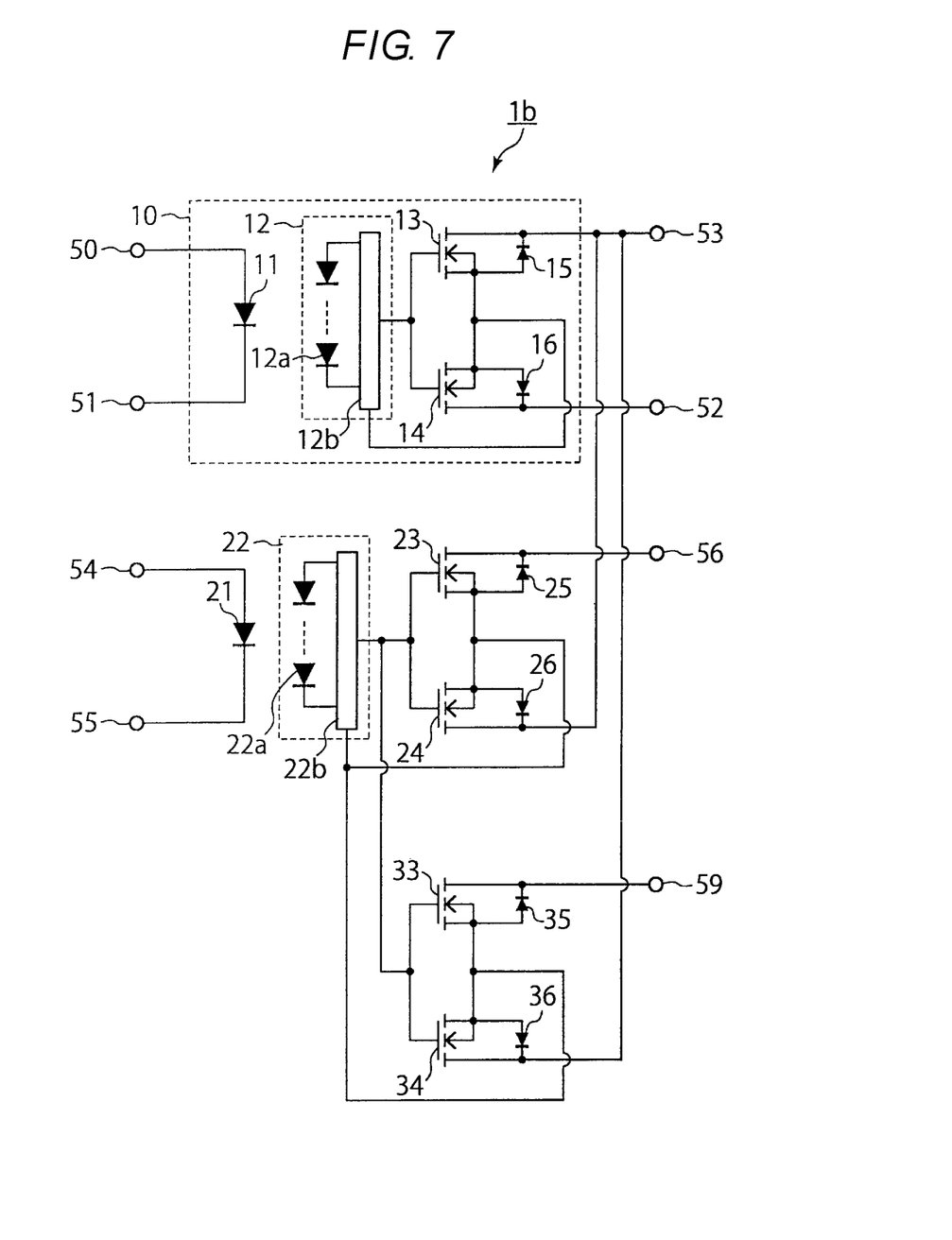
FIG. 7 is a circuit diagram of the optical coupling device according to the second modified example.

In the optical coupling device 1b, as depicted in FIG. 7, the N-type MOS transistors 23 and 24 and the N-type MOS transistors 33 and 34 are connected in common to the light-receiving element 22. That is, in the optical coupling device 1b, the light-emitting element 21 serves also as the light-emitting element 31 and the light-receiving element 22 serves also as the light-receiving element 32.

According to this modified example, since a space in which the light-emitting element 31 and the light-receiving element 32 are placed becomes unnecessary, the size of the device can be further reduced.

(Second Embodiment)

Figure 8:
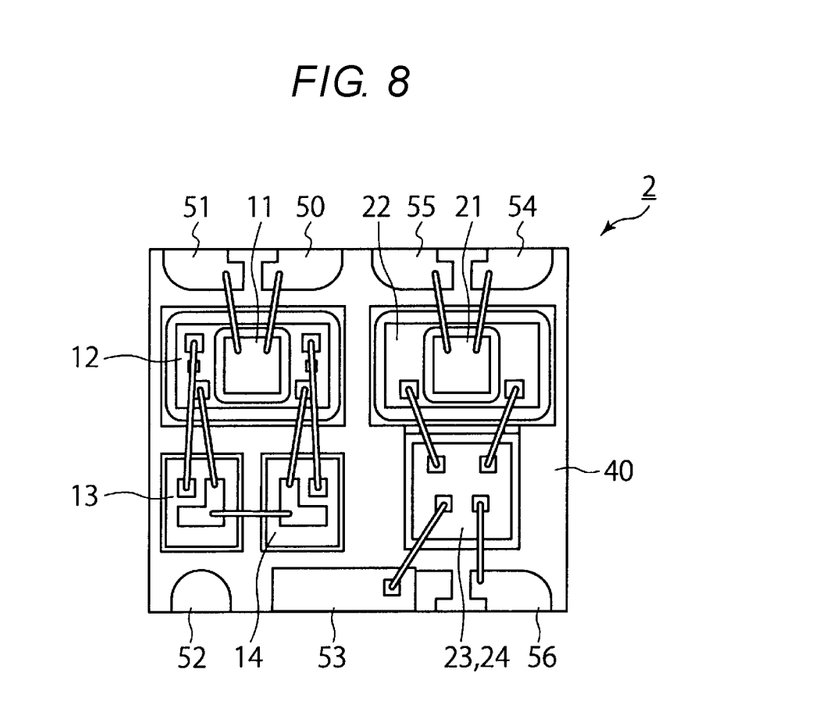
FIG. 8 is a plan view depicting the internal configuration of an optical coupling device according to a second embodiment.
Figure 9:
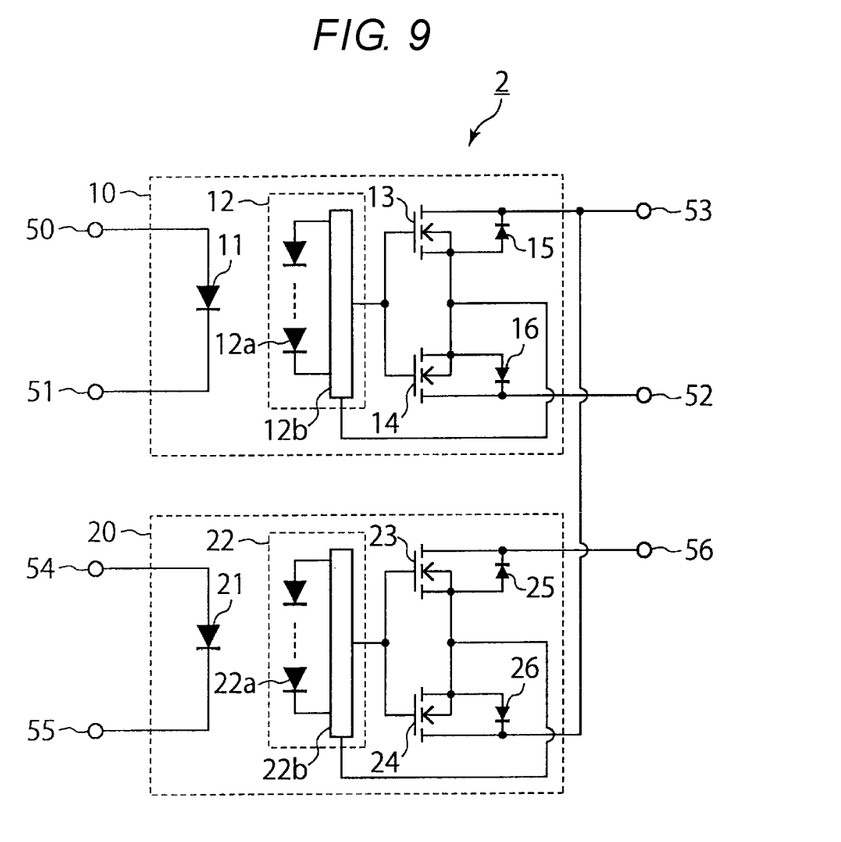
FIG. 9 is a circuit diagram of the optical coupling device according to the second embodiment.

FIG. 8 is a plan view depicting the internal configuration of an optical coupling device according to a second embodiment. Moreover, FIG. 9 is a circuit diagram of the optical coupling device 2 according to the second embodiment.

While the optical coupling device 1 according to the above-described first embodiment has the configuration that the three photorelays (10, 20, 30) are integrated on a single substrate, an optical coupling device 2 according to the second embodiment has the configuration in which two photorelays (10 and 20) are integrated on one substrate and a third photorelay can be on a separate substrate.

When the optical coupling device 2 is used as a tester for the DUT 72, the terminal 52 is connected to the pulse source 71 via the resistor R and the terminal 53 is connected to the DUT 72 as is also the case with the first embodiment. On the other hand, the terminal 56 may be connected to the sense pin 74 of the DC measuring unit 73 or may be connected to the force pin 75 of the DC measuring unit 73. That is, in the second embodiment, the DUT 72 can tested using the optical coupling device 2 in conjunction with a separate photorelay such as the photorelay 200 or the photorelay 300 in the comparative example (depicted in FIG. 4).

With the second embodiment configuration, an unnecessary space between the photorelay 10 and the photorelay 20 is eliminated. Therefore, according to the second embodiment, size reduction can be achieved as compared to the configuration in which the three photorelays (100, 200, 300) are each used singly as depicted in FIG. 4.

Furthermore, according to the second embodiment, the drain of the N-type MOS transistor 13 and the drain of the N-type MOS transistor 24 are connected in common to the terminal 53. Therefore, by increasing the space between the terminal 53 and the terminal 56, capacitive coupling between the terminals can be made less likely to occur. As a result, a leakage current of a high-frequency component can be reduced.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An optical coupling device, comprising:
   a first light-receiving element disposed on a first substrate and coupled to a first light-emitting element;
   a second light-receiving element disposed on the first substrate to be adjacent to the first light-receiving element and coupled to a second light-emitting element;
   a first terminal disposed on the first substrate;
   a second terminal disposed on the first substrate and adjacent to the first terminal;
   a third terminal disposed on the first substrate and adjacent to the second terminal;
   a first transistor pair disposed on a front surface of the first substrate and configured to electrically connect and disconnect the first and second terminals in response to a first light signal received by the first light-receiving element; and
   a second transistor pair disposed on the front surface of the first substrate and configured to electrically connect and disconnect the second and third terminals in response to a second light signal received by the second light-receiving element, wherein
   the first transistor pair includes:
      a first metal-oxide-semiconductor field effect transistor having a drain electrode connected to the first terminal through a first via extending through the first substrate and a first conductor disposed on a back surface of the first substrate, and
      a second metal-oxide-semiconductor field effect transistor having a drain electrode connected to the second terminal through a second via extending through the first substrate and a second conductor disposed on the back surface of the first substrate; and
   the second transistor pair includes:
      a third metal-oxide-semiconductor field effect transistor having a drain electrode connected to the third terminal through a first bonding wire, and
      a fourth metal-oxide-semiconductor field effect transistor having a drain electrode connected to the second terminal through a second bonding wire.

2. The optical coupling device according to claim 1, further comprising:
   a third light-receiving element disposed on the first substrate to be adjacent to the second light-receiving element and coupled to a third light-emitting element;
   a fourth terminal disposed on the first substrate and adjacent to third terminal; and
   a third transistor pair disposed on the first substrate and configured to electrically connect and disconnect the second and fourth terminals in response to a third light signal received by the third light-receiving element.

3. The optical coupling device according to claim 2, wherein the second and third transistor pairs are integrated in one chip.

4. The optical coupling device according to claim 2, further comprising:
   a pulse source connected to the first terminal through a resistor; and
   a direct current measuring unit connected to the third and fourth terminals.

5. The optical coupling device according to claim 1, further comprising:
   a fourth terminal disposed along the first edge to be adjacent to third terminal; and
   a third transistor pair disposed on the first substrate and configured to electrically connect and disconnect the second and fourth terminals in response to the second light signal received by the second light-receiving element.

6. The optical coupling device according to claim 5, wherein the second and third transistor pairs are integrated in one chip.

7. The optical coupling device according to claim 5, further comprising:
   a pulse source connected to the first terminal through a resistor; and
   a direct current measuring unit connected to the third and fourth terminals.

8. The optical coupling device according to claim 1, further comprising:
   a third light-receiving element and coupled to a third light-emitting element and disposed on a second substrate spaced from the first substrate;
   a fourth terminal and a fifth terminal, each disposed on the second substrate; and
   a third transistor pair disposed on the second substrate and configured to electrically connect and disconnect the fourth and fifth terminals in response to a third light signal received by the third light-receiving element.

9. The optical coupling device according to claim 8, further comprising:
   a pulse source connected to the first terminal through a resistor; and
   a direct current measuring unit connected to the third and fourth terminals.

10. The optical coupling device according to claim 1, wherein the first and second metal-oxide-semiconductor field effect transistors are n-channel transistors.

11. The optical coupling device according to claim 1, wherein the first and second transistor pairs are comprised of n-channel metal-oxide-semiconductor field effect transistors.

12. An optical coupling device, comprising:
   a first photorelay on a first substrate;
   a second photorelay on the first substrate and adjacent to the first photorelay;
   a third photorelay adjacent to the second photorelay;
   a first terminal on the first substrate;
   a second terminal on the first substrate and adjacent to the first terminal; and
   a third terminal on the first substrate and adjacent to the second terminal, wherein
   the first photorelay is configured to electrically connect the first terminal to the second terminal in response to a current signal supplied to the first photorelay,
   the second photorelay is configured to electrically connect the second terminal to the third terminal in response to a current signal supplied to the second photorelay,
   the third photorelay is configured to electrically connect a device test terminal to a fourth terminal in response to a current signal supplied to the third photorelay, and electric connection between the first and second terminals in response to the current signal supplied to the first photorelay is made through at least one via in the first substrate.

13. The optical coupler according to claim 12, wherein the third photorelay is disposed on the first substrate, the fourth terminal is disposed on the first substrate, and the device test terminal is the second terminal.

14. A device tester, comprising:
a first photorelay on a substrate;
a second photorelay on the substrate and adjacent to the first photorelay;
a third photorelay on the substrate and adjacent to the second photorelay;
a first terminal along a first edge of the substrate;
a second terminal along the first edge and adjacent to the first terminal;
a third terminal along the first edge and adjacent to the second terminal; and
a fourth terminal along the first edge and adjacent to the third terminal, wherein
the first photorelay is configured to electrically connect the first terminal to the second terminal in response to a current signal supplied to the first photorelay,
the second photorelay is configured to electrically connect the second terminal to the third terminal in response to a current signal supplied to the second photorelay, and
the third photorelay is configured to electrically connect the second terminal to the fourth terminal in response to a current signal supplied to the third photorelay, wherein
the first photorelay comprises:
  a first light-emitting element;
  a first light-receiving element coupled to the first light-emitting element;
  a first n-channel transistor having a drain electrode connected to the first terminal and a gate electrode connected to the first light-receiving element; and
  a second n-channel transistor having a drain electrode connected to the second terminal, a gate electrode connected to the first light-receiving element, and a source electrode connected to a source electrode of the first n-channel transistor, wherein
  the drain electrodes of the first and second n-channel transistors are facing the substrate, and
  the source electrodes of the first and second n-channel transistors are facing away from the substrate;
the second photorelay comprises:
  a second light-emitting element;
  a second light-receiving element coupled to the second light-emitting element;
  a third n-channel transistor having a drain electrode connected to the third terminal and a gate electrode connected to the second light-receiving element; and
  a fourth n-channel transistor having a drain electrode connected to the second terminal, a gate electrode connected to the second light-receiving element, and a source electrode connected to a source electrode of the third n-channel transistor, wherein
  the drain electrodes of the third and fourth n-channel transistors are facing away from the substrate, and
  the source electrodes of the third and fourth n-channel transistors are facing away from the substrate;
the connection between the drain electrode of the second n-channel transistor and the second terminal is through a via through the substrate; and
the connection between the drain electrode of the fourth n-channel transistor and the second terminal is through a bonding wire.

15. The device tester according to claim 14, further comprising:
a pulse source connected to the first terminal through a resistor; and
a direct current measuring unit connected to the third and fourth terminals.

* * * * *